United States Patent [19]

Bouzidi et al.

[11] Patent Number: 5,684,844
[45] Date of Patent: Nov. 4, 1997

[54] PHASE-LOCKING METHOD AND A LOOP APPLYING THE METHOD

[75] Inventors: Jean-Pierre Bouzidi; Joseph Ropars, both of Lannion, France

[73] Assignee: Alcatel CIT, Paris, France

[21] Appl. No.: 655,143

[22] Filed: May 30, 1996

[30] Foreign Application Priority Data

May 31, 1995 [FR] France ................... 95 06458

[51] Int. Cl.$^6$ .......................................... H03D 3/24
[52] U.S. Cl. .............................. 375/376; 331/17
[58] Field of Search ............................ 331/17, 1 A, 18, 331/23; 375/331, 376; 360/36, 40, 65

[56] References Cited

U.S. PATENT DOCUMENTS

| | | | |
|---|---|---|---|
| 4,297,728 | 10/1981 | Lowe | 360/36 |
| 4,404,530 | 9/1983 | Stryer . | |
| 4,686,689 | 8/1987 | Rorden | 375/331 |
| 4,745,371 | 5/1988 | Haine | 331/17 |
| 5,319,680 | 6/1994 | Port et al. | 375/376 |
| 5,570,398 | 10/1996 | Smith | 375/376 |

FOREIGN PATENT DOCUMENTS

0155396A3  9/1985  European Pat. Off. .

*Primary Examiner*—Stephen Chin
*Assistant Examiner*—Joseph Roundtree
*Attorney, Agent, or Firm*—Sughrue, Mion, Zinn, Macpeak & Seas, PLLC

[57] ABSTRACT

The relates to locking the phase of output signal (Ys) relative to an input signal (Ye). A first frequency correction signal (Yr1) is obtained by integrating a signal representative of an error of said phase relative to a reference defined by the input signal. It then cooperates with a second frequency correction signal (Yr2) to correct the frequency of an oscillator (VCO) supplying the output signal. The second frequency correction signal is obtained with the help of an adjustment signal (Yg) by integrating an error of the first frequency correction signal (Yr1) relative to said adjustment signal. The adjustment signal may itself be obtained by integrating a frequency error. The invention is particularly applicable to telecommunications systems.

3 Claims, 1 Drawing Sheet

PHASE-LOCKING METHOD AND A LOOP APPLYING THE METHOD

BACKGROUND OF THE INVENTION

The present invention relates in particular to a phase-locked loop, and an advantageous application thereof lies in making integrated electronic circuits that operate digitally.

Such a loop may be used, in particular, in a telecommunications system for forming a clock signal from a data-carrying digital type signal. For that purpose, a first clock signal is formed from the data carrier signal and said first clock signal is applied as an input signal to a phase-locked loop. The loop responds by supplying an output signal which constitutes a second clock signal having better shape qualities than the first clock signal. The second clock signal can be used to regenerate the phase of the data carrier signal prior to forwarding it to receiver circuits.

An essential quality of such a loop is that its output signal tracks as closely as possible both the frequency and the phase of its input signal.

As shown in FIG. 1, a known phase-locked loop comprises:

an input E' for receiving an alternating input signal Ye' defining a reference phase;

a phase comparator CP' responsive firstly to said reference phase and secondly to the phase of an alternating output signal Ys' having an output frequency, said comparator supplying a phase error signal representative of a phase error as presented by the output signal relative to the reference phase;

a phase error integrator I1' receiving and integrating said phase error signal to supply a frequency correction signal Yr1'; and a loop oscillator VCO' having its own frequency and receiving the frequency correction signal. This oscillator provides the output signal by inserting between its own frequency and the frequency of the output controlled by the frequency correction signal, a difference presenting a direction suitable for reducing the phase error.

As is well known, it should be understood that the integrators used in this technical field have limited gain at zero frequency, i.e. they do not perform integration in the mathematical sense of the term, but rather they perform filtering that eliminates high frequencies.

By way of example, the phase comparator may be of a type described in the book "Technique des boucles d'asservissement de phase" [Phase servo-controlled loop techniques], by Alain Blanchard, published by Ecole Supérieure d'Electricité (Paris), (Chapter 2), or in the book "Phase-locked loops" by Roland E. Best, published by McGraw-Hill (Chapter 4).

Typically, a phase comparator cannot operate at the frequency common to the input signal Ye and to the output signal Ys, e.g. 155 MHz. That is why the frequency is divided before phase comparison by means of a divider $D'_e$ or D's which divides by an integer.

Such a loop makes it possible to set the phase of the output signal accurately on the reference phase providing, in particular, that the natural frequency of the loop oscillator is equal to the input frequency. Unfortunately, even when the input frequency is a predetermined fixed frequency, this condition is difficult to satisfy in an industrial context.

Oscillators manufactured in such a context necessarily have a certain spread of characteristics, and in particular of their natural frequencies. In addition, these characteristics can vary over time. As a result, the natural frequency of the oscillator is generally different from the input frequency, and thus from the output frequency.

This frequency error must be compensated by a non-zero correction signal, i.e. a residual phase error appears even under steady conditions. This phase error increases with increasing frequency error.

In order to reduce the residual phase error, it is known to apply a second frequency correction signal Yr'2 to the loop oscillator which is added to the first and which is of a value that is fixed during manufacture of the loop to compensate for the error observed between the natural frequency of the oscillator and the predetermined input frequency.

The residual phase error is thus decreased, but it subsists, particularly when the natural frequency of the oscillator varies over time or when the input frequency varies.

SUMMARY OF THE INVENTION

Particular objects of the present invention are to further reduce said residual phase error and to facilitate adapting the loop to variation in the input frequency.

To this end, the invention provides a method of phase-locking an output signal relative to an input signal, in which method a first frequency correction signal is obtained by integrating a signal representative of an error in said phase relative to a reference phase defined by an input signal, and then said first frequency correction signal co-operates with a second frequency correction signal for correcting the frequency of an oscillator supplying said output signal, said method being characterized by the fact that the second frequency correction signal is obtained with the help of an adjustment signal by integrating an error of the first frequency correction signal relative to said adjustment signal.

DETAILED DESCRIPTION OF THE INVENTION

Figure 1:
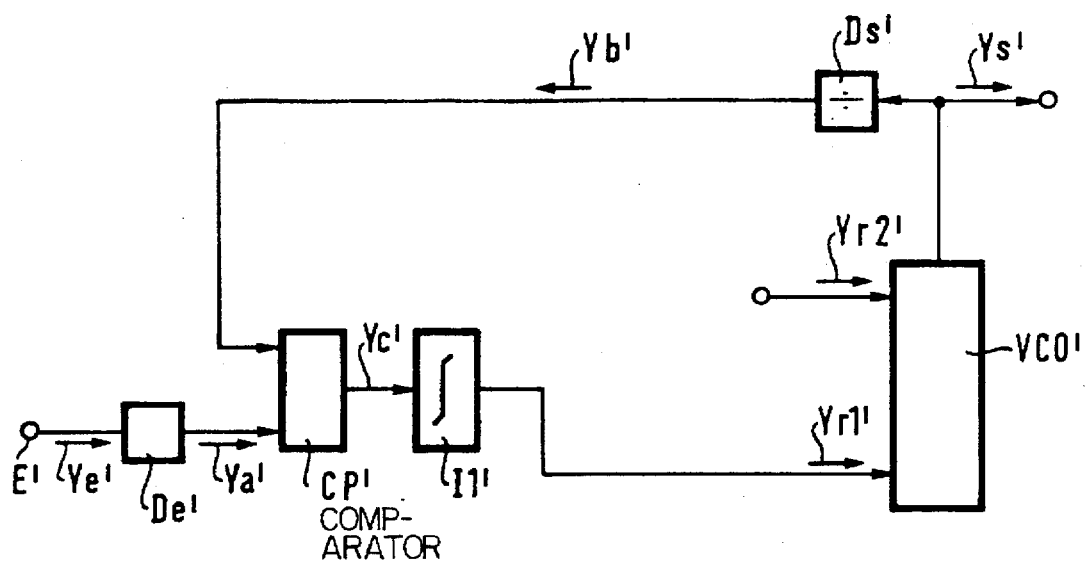
FIG. 1 shows a known phase-locked loop and is described above.
Figure 2:
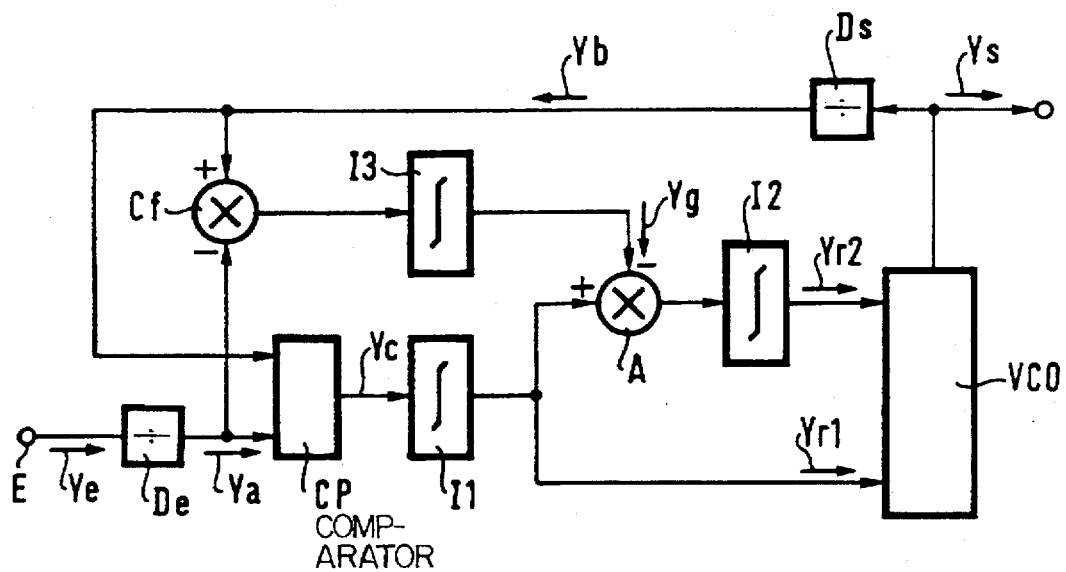
FIG. 2 shows a phase-locked loop of the present invention.

In FIG. 2, the loop of the invention includes, in conventional manner, an input E receiving an alternating input signal, and more particularly a binary signal, Ye. The frequency of this signal may include fluctuations about a mean value constituting an input frequency fe. This mean value may itself be subject to variation over time. This signal defines a reference phase.

A phase comparator CP receives both the input signal via a frequency divider De and an alternating output signal Ys via a frequency divider Ds. The numbers by which these frequency dividers divide are selected to bring two equal frequencies to the phase comparator CP. The output signal Ys has an output frequency fs and a phase error θs relative to the reference phase. The comparator CP provides a phase error signal Yc representative of said phase error. A phase error integrator I1 receives and integrates said phase error signal to provide a frequency correction signal Yr1 in the form of a voltage.

Frequency error compensation means described below in greater detail supply a second frequency correction signal Yr2 likewise in the form of a voltage. Finally, a loop oscillator VCO having a natural frequency f0 receives the first and second frequency correction signals and provides the output signal Ys. Between its natural frequency and the output frequency fs, it inserts a difference that increases with the first and second frequency correction signals and that is in a direction suitable for reducing said phase error.

According to the present invention, the frequency error compensation means comprise:

adjustment means for providing an adjustment signal Yg;

an adder A receiving both the first frequency correction signal and the adjustment signal, and subtracting the adjustment signal from the first frequency correction signal to provide a compensation error signal; and a compensation integrator I2 that receives and integrates the compensation error signal to provide the signal frequency correction signal.

Preferably, and as shown, said adjustment means comprise a frequency comparator Cf receiving both the input signal Ya and the output signal Ys. This comparator responds by providing a frequency error signal representative of a frequency error presented by the output frequency compared with the input frequency. By way of example, the frequency error signal may have a zero value when the frequency error remains within certain limits, i.e. when it remains smaller in absolute value than a predetermined threshold which depends on the selected elements CP, I1, and VCO. In this example, it may present a value of −1 or a value of +1 when the frequency error moves outside said limits respectively in one direction or the other. A frequency error integrator I3 receives and integrates said frequency error signal to provide the adjustment signal Yg by causing said adjustment signal to vary in a direction that is suitable for reducing said frequency error.

When the loop starts up, this structure for the adjustment means makes it possible to compensate for possible errors between the input frequency and the natural frequency of the oscillator. On the contrary, if the adjustment signal were constant, then such errors could prevent the loop oscillator locking onto the input signal.

We claim:

1. A method of phase-locking an output signal (Ys) relative to an input signal (Ye), said method comprising the steps of obtaining a first frequency correction signal (Yr1) by integrating a signal representative of an error in the phase of said output signal relative to a phase of said input signal, and then correcting the frequency of an oscillator (VCO) supplying said output signal in accordance with said first frequency correction signal and a second frequency correction signal (Yr2), said method being characterized in that said second frequency correction signal (Yr2) is obtained by integrating an error of the first frequency correction signal (Yr1) relative to an adjustment signal (Yg).

2. A phase-locked loop comprising:

an input (E) for receiving an alternating input signal (Ye) having an input frequency (fe) and defining a reference phase;

a phase comparator (CP) responsive firstly to said reference phase and secondly to the phase of an alternating output signal (Ys) having an output frequency (fs), said comparator supplying a phase error signal (Yc) representative of a phase error (θs) presented by the output signal relative to the reference phase;

a phase error integrator (I1) receiving and integrating said phase error signal to provide a first frequency correction signal (Yr1);

frequency error compensation means providing a second frequency correction signal (Yr2); and a loop oscillator (VCO) having a natural frequency (f0) and receiving the first and second frequency correction signals, said oscillator supplying said output signal (Ys) and inserting between its said natural frequency and said output frequency (fs) a difference that increases with said first and second frequency correction signals and that presents a direction suitable for reducing said phase error;

said loop being characterized by the fact that said frequency error compensation means comprise:

adjustment means for supplying an adjustment signal (Yg);

an adder (A) receiving both said first frequency correction signal and said adjustment signal, and subtracting said adjustment signal from the first correction signal to supply a compensation error signal; and a compensation integrator (I2) receiving and integrating the compensation error signal to supply the second frequency correction signal.

3. A loop according to claim 2, characterized by the fact that said adjustment means comprise:

a frequency comparator (Cf) responsive firstly to said input frequency (fe) and secondly to said output frequency (fs) and supplying in response thereto a frequency error signal representative of a frequency error presented by said output frequency relative to said input frequency; and a frequency error integrator (I3) receiving and integrating said frequency error signal to supply said adjustment signal (Yg) by making said adjustment signal vary in a direction that is suitable for reducing said frequency error.

* * * * *